(12) United States Patent
Kim et al.

(10) Patent No.: US 10,382,008 B2
(45) Date of Patent: Aug. 13, 2019

(54) SURFACE ACOUSTIC WAVE DEVICE FOR SUPPRESSING TRANSVERSE MODE

(71) Applicant: WISOL CO., LTD., Gyeonggi-do (KR)

(72) Inventors: Ah Sung Kim, Gyeonggi-do (KR); Chul Hwa Lee, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 286 days.

(21) Appl. No.: 15/437,136

(22) Filed: Feb. 20, 2017

(65) Prior Publication Data

US 2017/0244378 A1   Aug. 24, 2017

(30) Foreign Application Priority Data

Feb. 24, 2016   (KR) .................. 10-2016-0021810

(51) Int. Cl.
*H03H 9/64* (2006.01)
*H03H 9/02* (2006.01)
*H03H 9/145* (2006.01)

(52) U.S. Cl.
CPC ...... *H03H 9/02992* (2013.01); *H03H 9/1457* (2013.01); *H03H 9/64* (2013.01)

(58) Field of Classification Search
CPC ................................. H03H 9/02992
USPC .................. 310/313 A, 313 B, 313 R, 313 C
See application file for complete search history.

(56) References Cited

U.S. PATENT DOCUMENTS

| 7,538,637 | B2* | 5/2009 | Mayer | H03H 9/02881 310/313 R |
| 7,939,989 | B2* | 5/2011 | Solal | H03H 9/02858 310/313 B |
| 8,294,331 | B2* | 10/2012 | Abbott | H03H 9/02858 310/313 C |
| 10,284,176 | B1* | 5/2019 | Solal | G10K 11/18 |

OTHER PUBLICATIONS

Solal, M. et al., "Design Modeling and Visualization of Low Transverse Modes R-SPUDT Devices", IEEE Ultrasonics Symposium, 2006, p. 82-87.

* cited by examiner

*Primary Examiner* — Thomas M Dougherty
*Assistant Examiner* — Karen B Addison
(74) *Attorney, Agent, or Firm* — Harness, Dickey & Pierce, P.L.C.

(57) ABSTRACT

Disclosed is a surface acoustic wave device including a piezoelectric substrate, first and second bus bars formed on the piezoelectric substrate to be opposite each other, a plurality of first inter-digital electrodes that are electrically connected to the first bus bar and extend from the first bus bar toward the second bus bar, and a plurality of second inter-digital electrodes that are electrically connected to the second bus bar and extend from the second bus bar toward the first bus bar, in which the first inter-digital electrodes and the second inter-digital electrodes are alternately arranged.

4 Claims, 7 Drawing Sheets

SURFACE ACOUSTIC WAVE DEVICE FOR SUPPRESSING TRANSVERSE MODE

CROSS-REFERENCE TO RELATED APPLICATION

This application claims priority to and the benefit of Korean Patent Application No. 2016-0021810, filed on Feb. 24, 2016, the disclosure of which is incorporated herein by reference in its entirety.

FIELD

The present invention relates to a surface acoustic wave device, and more particularly, to a surface acoustic wave device for removing the spurious by suppressing an unnecessary transverse mode, reducing ripples that occur in a pass band, and improving an insertion loss.

BACKGROUND

Figure 1:
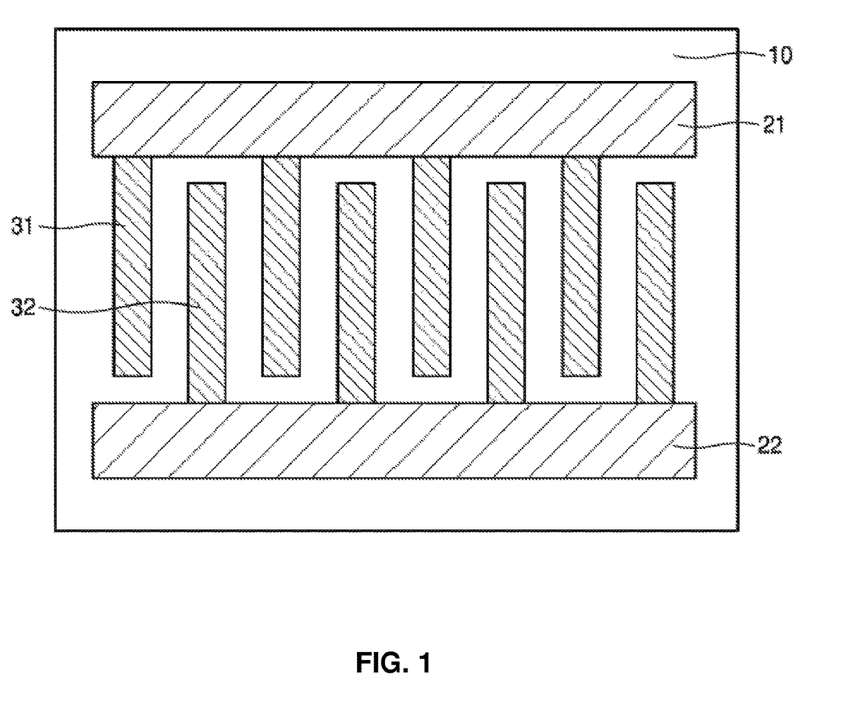
FIG. 1 illustrates an example of a structure of a general surface acoustic wave device.

A surface acoustic wave device converts electrical energy into acoustic wave energy or converts acoustic wave energy into electrical energy. For example, the surface acoustic wave device, as shown in FIG. 1, includes a piezoelectric substrate 10, bus bars 21 and 22 formed on the substrate 10 to be opposite each other, and inter-digital electrodes 31 and 32 connected to the bus bars 21 and 22 respectively to be alternately arranged.

One of problems of the surface acoustic wave device is an unnecessary transverse mode. The transverse mode generates spurious responses, causes undesirable ripples, or increases an insertion loss. This phenomenon has a bad influence on properties of the surface acoustic wave device.

As one of methods for suppressing a transverse mode in a surface acoustic wave device, document titled "Design Modeling and Visualization for Low Transverse Modes R-SPUDT devices" provides a so-called piston mode in which a wave velocity reduction region is added to an edge of a transducer to generate a mode in which a velocity is regular at an opening and becomes reduced as getting toward the outside. However, it is difficult to embody a structure disclosed in the document due to a complicated pattern and there is a high possibility that a failure occurs.

SUMMARY

It is an aspect of the present invention to provide a surface acoustic wave device capable of suppressing a transverse mode through a simpler structure.

One aspect of the present invention provides a surface acoustic wave device including a piezoelectric substrate, first and second bus bars formed on the piezoelectric substrate to be opposite each other, a plurality of first inter-digital electrodes that are electrically connected to the first bus bar and extend from the first bus bar toward the second bus bar, and a plurality of second inter-digital electrodes that are electrically connected to the second bus bar and extend from the second bus bar toward the first bus bar, in which the first inter-digital electrodes and the second inter-digital electrodes are alternately arranged. Here, a central region of the first and second inter-digital electrodes, a first edge region between the central region and the first bus bar, and a second edge region between the central region and the second bus bar are defined according to a wave propagation direction. Also, protruding portions are formed at only the first inter-digital electrodes in the first edge region and formed at only the second inter-digital electrodes in the second edge region to allow wave velocities in the first and second edge regions to be smaller than a wave velocity in the central region.

Widths of the protruding portions may be larger than widths of the first and second inter-digital electrodes in the central region.

Thicknesses of the protruding portions may be larger than thicknesses of the first and second inter-digital electrodes in the central region.

Widths and thicknesses of the protruding portions may be larger than widths and thicknesses of the first and second inter-digital electrodes in the central region.

Another aspect of the present invention provides a surface acoustic wave device including a piezoelectric substrate, first and second bus bars formed on the piezoelectric substrate to be opposite each other, a plurality of first inter-digital electrodes that are electrically connected to the first bus bar and extend from the first bus bar toward the second bus bar, and a plurality of second inter-digital electrodes that are electrically connected to the second bus bar and extend from the second bus bar toward the first bus bar, in which the first inter-digital electrodes and the second inter-digital electrodes are alternately arranged. Here, a central region of the first and second inter-digital electrodes, a first edge region between the central region and the first bus bar, and a second edge region between the central region and the second bus bar are defined according to a wave propagation direction. Also, protruding portions are formed at only the second inter-digital electrodes in the first edge region and formed at only the first inter-digital electrodes in the second edge region to allow wave velocities in the first and second edge regions to be smaller than a wave velocity in the central region.

Widths of the protruding portions may be larger than widths of the first and second inter-digital electrodes in the central region.

Thicknesses of the protruding portions may be larger than thicknesses of the first and second inter-digital electrodes in the central region.

Widths and thicknesses of the protruding portions may be larger than widths and thicknesses of the first and second inter-digital electrodes in the central region.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION

Hereinafter, exemplary embodiments of the present invention will be described in detail with reference to the drawings. In the following description and attached drawings, substantially like components will be referred to as like reference numerals and a repeated description thereof will be omitted. Also, throughout the description of the embodiments of the present invention, detailed explanations of well-known functions and components of the related art will be omitted when it is deemed that they may unnecessarily obscure the essence of the present invention.

Figure 2:
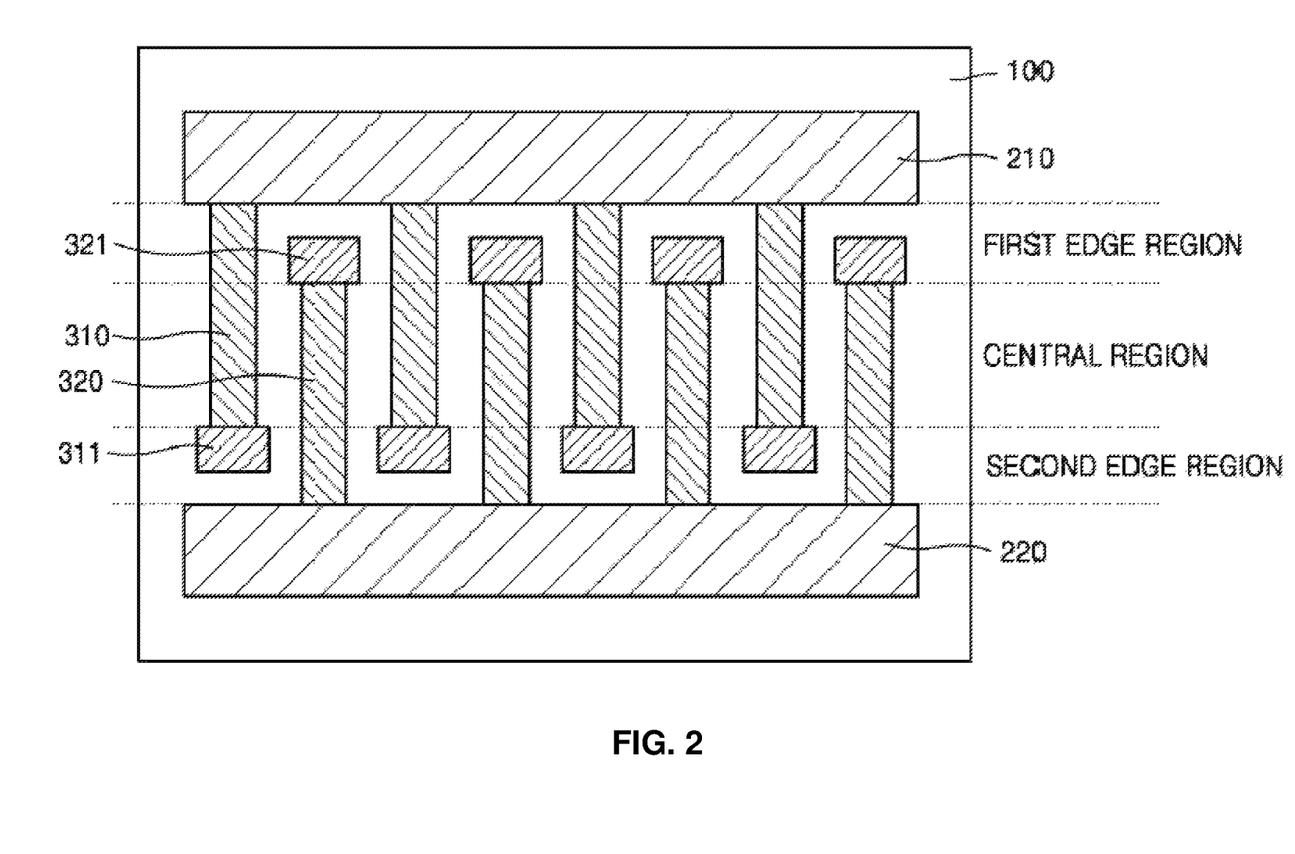
FIG. 2 is a view illustrating a structure of a surface acoustic wave device according to a first embodiment of the present invention.

FIG. 2 is a view illustrating a structure of a surface acoustic wave device according to a first embodiment of the present invention.

Referring to FIG. 2, the surface acoustic wave device according to the embodiment includes a piezoelectric substrate 100, first and second bus bar 210 and 220 formed on the piezoelectric substrate 100 to be opposite each other, a plurality of first inter-digital electrodes 310 that are electrically connected to the first bus bar 210 and extend from the first bus bar 210 toward the second bus bar 220, and a plurality of second inter-digital electrodes 320 that are electrically connected to the second bus bar 220 and extend from the second bus bar 220 toward the first bus bar 210. Here, the first inter-digital electrodes 310 and the second inter-digital electrodes 320 are alternately arranged.

In the embodiments of the present invention, according to a wave propagation direction (a perpendicular direction to the first and second inter-digital electrodes 310 and 320), a central region of the first and second inter-digital electrodes 310 and 320, a first edge region between the central are and the first bus bar 210, and a second edge region between the central region and the second bus bar 220 are defined.

The second inter-digital electrodes 320 include protruding portions 321 having larger widths in the first edge region than those in the central region, and the first inter-digital electrodes 310 include protruding portions 311 having larger widths in the second edge region than those in the central region. Accordingly, wave velocities in the first edge region and the second edge region become smaller than a wave velocity in the central region.

In the first edge region, the protruding portions of not only the second inter-digital electrodes 320 but also the first inter-digital electrodes 310 may have larger widths than widths in the central region. However, since a gap between the protruding portion 321 of the second inter-digital electrode 320 and the protruding portion of the first inter-digital electrode 310 adjacent thereto becomes narrower, there is a difficulty in embodying a corresponding electrode pattern. Like this, in the second edge region, the protruding portions of not only the first inter-digital electrodes 310 but also the second inter-digital electrodes 320 may have larger widths than widths in the central region. However, since a gap between the protruding portion 311 of the first inter-digital electrode 310 and the protruding portion of the second inter-digital electrode 320 adjacent thereto becomes narrower, there is a difficulty in embodying a corresponding electrode pattern. For example, the electrode pattern may be formed through a photolithography process. However, when a gap between electrodes is narrow, it is difficult to embody the electrode pattern using the photolithography process and a possibility that a defective occurs becomes increased.

In the embodiment of the present invention, in the first edge region, the second inter-digital electrodes 320 include the protruding portions 321 but the first inter-digital electrodes 310 do not include protruding portions. Like this, in the second edge region, the first inter-digital electrodes 310 include the protruding portions 311 but the second inter-digital electrodes 320 do not include protruding portions. Accordingly, there are a merit in process and an advantage of decreasing a fraction defective rather than a case of forming protruding portions at both the first inter-digital electrodes 310 and the second inter-digital electrodes 320 in the same edge region.

Figure 3:
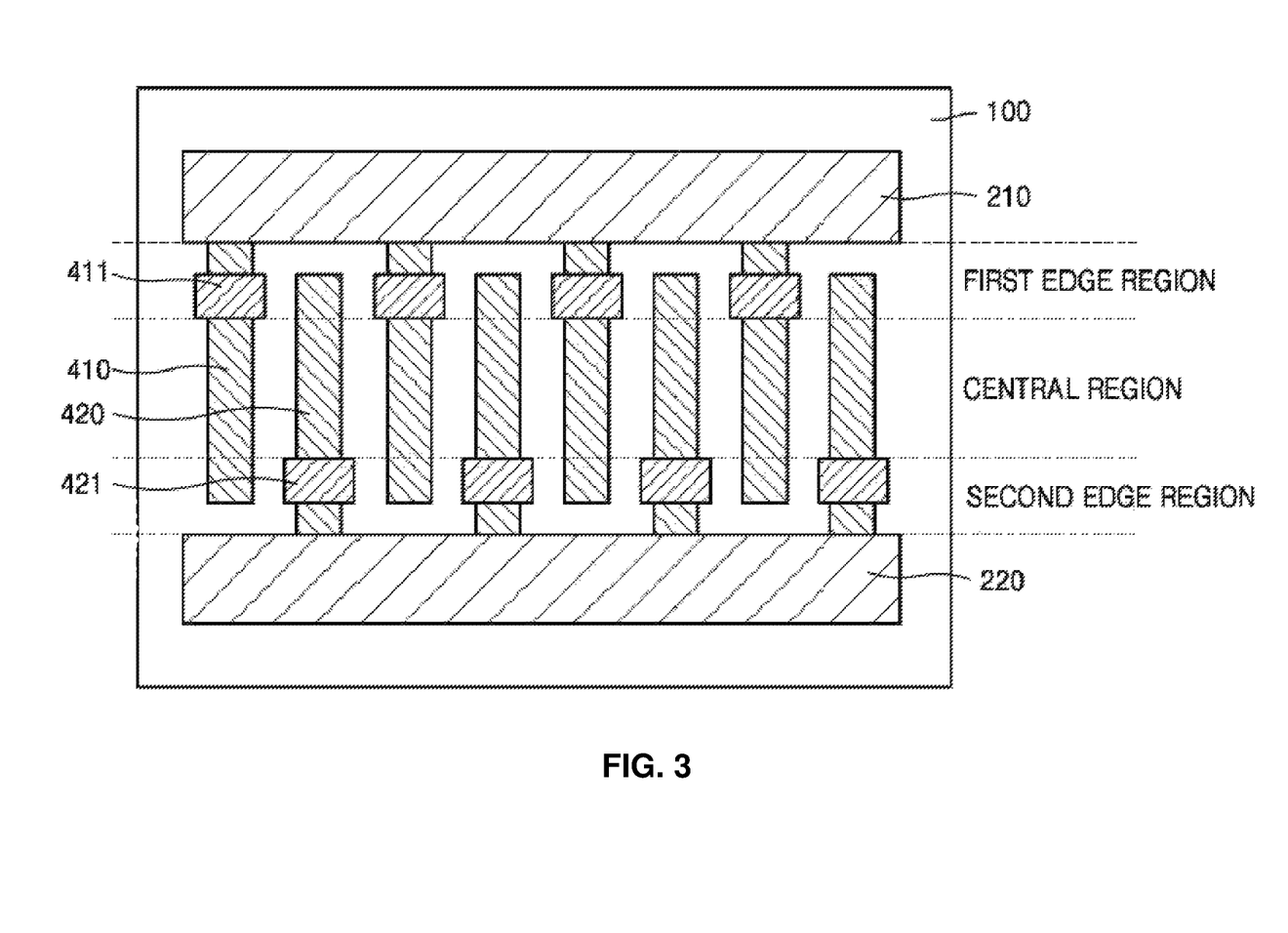
FIG. 3 is a view illustrating a structure of a surface acoustic wave device according to a second embodiment of the present invention.

FIG. 3 is a view illustrating a structure of a surface acoustic wave device according to a second embodiment of the present invention.

Referring to FIG. 3, the surface acoustic wave device according to the embodiment includes a piezoelectric substrate 100, first and second bus bar 210 and 220 formed on the piezoelectric substrate 100 to be opposite each other, a plurality of first inter-digital electrodes 410 that are electrically connected to the first bus bar 210 and extend from the first bus bar 210 toward the second bus bar 220, and a plurality of second inter-digital electrodes 420 that are electrically connected to the second bus bar 220 and extend from the second bus bar 220 toward the first bus bar 210. Here, the first inter-digital electrodes 410 and the second inter-digital electrodes 420 are alternately arranged.

The first inter-digital electrodes 410 include protruding portions 411 having larger widths in the first edge region than those in the central region, and the second inter-digital electrodes 420 include protruding portions 421 having larger widths in the second edge region than those in the central region. Accordingly, wave velocities in the first edge region and the second edge region become smaller than a wave velocity in the central region.

In the first edge region, the protruding portions of not only the first inter-digital electrodes 410 but also the second inter-digital electrodes 420 may have larger widths than widths in the central region. However, since a gap between the protruding portion 411 of the first inter-digital electrode 410 and the protruding portion of the second inter-digital electrode 420 adjacent thereto becomes narrower, there is a difficulty in embodying a corresponding electrode pattern. Like this, in the second edge region, the protruding portions of not only the second inter-digital electrodes 420 but also the first inter-digital electrodes 410 may have larger widths than widths in the central region. However, since a gap between the protruding portion 421 of the second inter-digital electrode 420 and the protruding portion of the first inter-digital electrode 410 adjacent thereto becomes narrower, there is a difficulty in embodying a corresponding electrode pattern.

In the embodiment of the present invention, in the first edge region, the first inter-digital electrodes 410 include the protruding portions 411 but the second inter-digital electrodes 420 do not include protruding portions. Like this, in the second edge region, the second inter-digital electrodes 420 include the protruding portions 421 but the first inter-digital electrodes 410 do not include protruding portions. Accordingly, there are a merit in process and an advantage of decreasing a fraction defective rather than a case of forming protruding portions at both the first inter-digital electrodes 410 and the second inter-digital electrodes 420 in the same edge region.

Figure 4:
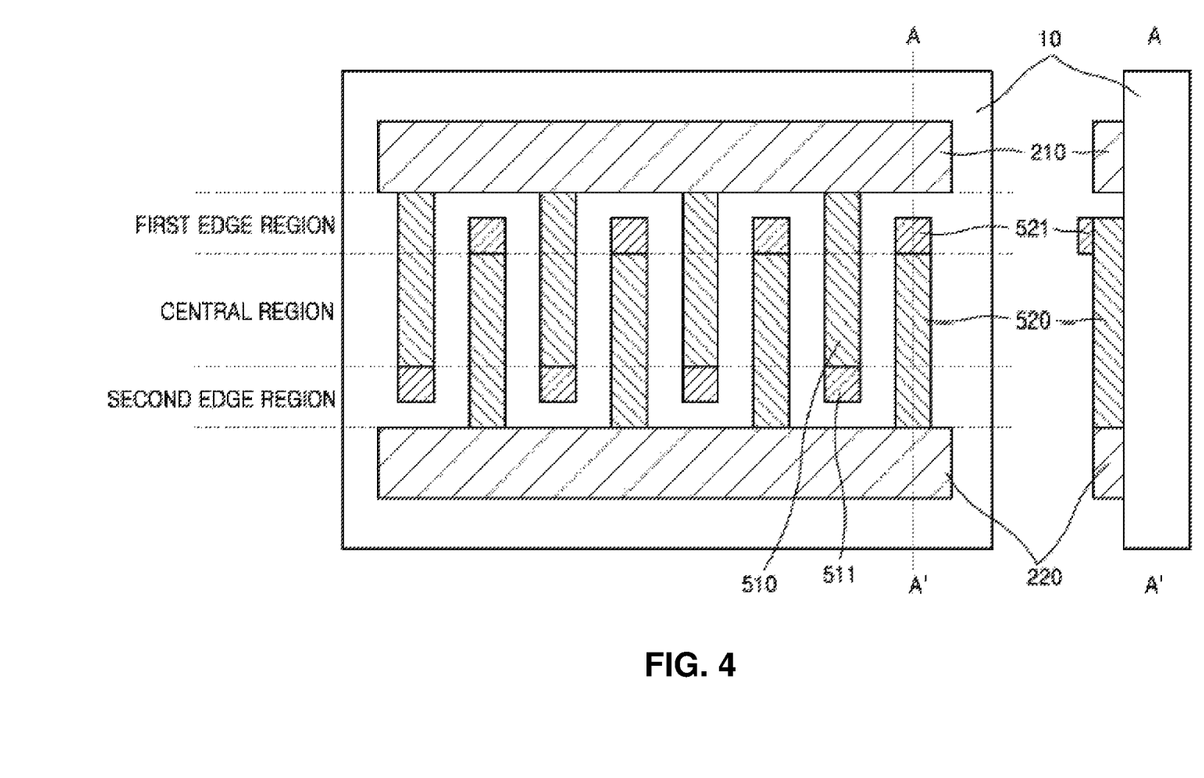
FIG. 4 is a view illustrating a structure of a surface acoustic wave device according to a third embodiment of the present invention.

FIG. 4 is a view illustrating a structure of a surface acoustic wave device according to a third embodiment of the present invention.

Referring to FIG. 4, the surface acoustic wave device according to the embodiment includes a piezoelectric substrate 100, first and second bus bar 210 and 220 formed on the piezoelectric substrate 100 to be opposite each other, a plurality of first inter-digital electrodes 510 that are electrically connected to the first bus bar 210 and extend from the first bus bar 210 toward the second bus bar 220, and a plurality of second inter-digital electrodes 520 that are electrically connected to the second bus bar 220 and extend from the second bus bar 220 toward the first bus bar 210. Here, the first inter-digital electrodes 510 and the second inter-digital electrodes 520 are alternately arranged.

The second inter-digital electrodes 520 include protruding portions 521 having larger thicknesses in the first edge region than those in the central region, and the first inter-digital electrodes 510 include protruding portions 511 having larger thicknesses in the second edge region than those in the central region. Accordingly, wave velocities in the first edge region and the second edge region become smaller than a wave velocity in the central region.

Even though not only the second inter-digital electrodes 520 but also the first inter-digital electrodes 510 may include protruding portions having larger thicknesses in the first edge region than those in the central region, it is difficult to form protruding portions having larger thicknesses in the respective adjacent electrodes. Like this, even though not only the first inter-digital electrodes 510 but also the second inter-digital electrodes 520 may include protruding portions having larger thicknesses in the second edge region than those in the central region, it is difficult to form protruding portions having larger thicknesses in the respective adjacent electrodes.

In the embodiment of the present invention, in the first edge region, the second inter-digital electrodes 520 include the protruding portions 521 but the first inter-digital electrodes 510 do not include protruding portions. Like this, in the second edge region, the first inter-digital electrodes 510 include the protruding portions 511 but the second inter-digital electrodes 520 do not include protruding portions. Accordingly, there are a merit in process and an advantage of decreasing a fraction defective rather than a case of forming protruding portions at both the first inter-digital electrodes 510 and the second inter-digital electrodes 520 in the same edge region.

Figure 5:
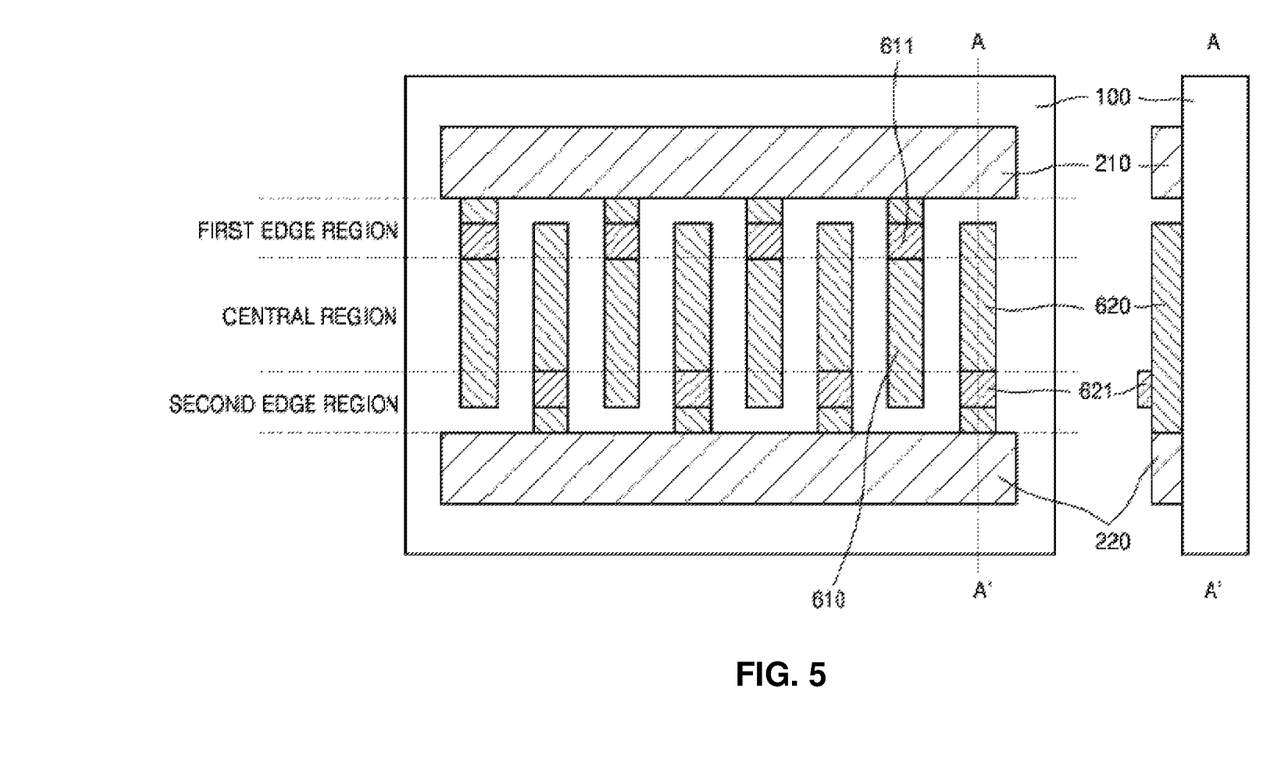
FIG. 5 is a view illustrating a structure of a surface acoustic wave device according to a fourth embodiment of the present invention.

FIG. 5 is a view illustrating a structure of a surface acoustic wave device according to a fourth embodiment of the present invention.

Referring to FIG. 5, the surface acoustic wave device according to the embodiment includes a piezoelectric substrate 100, first and second bus bar 210 and 220 formed on the piezoelectric substrate 100 to be opposite each other, a plurality of first inter-digital electrodes 610 that are electrically connected to the first bus bar 210 and extend from the first bus bar 210 toward the second bus bar 220, and a plurality of second inter-digital electrodes 620 that are electrically connected to the second bus bar 220 and extend from the second bus bar 220 toward the first bus bar 210. Here, the first inter-digital electrodes 610 and the second inter-digital electrodes 620 are alternately arranged.

The first inter-digital electrodes 610 include protruding portions 611 having larger thicknesses in the first edge region than those in the central region, and the second inter-digital electrodes 620 include protruding portions 621 having larger thicknesses in the second edge region than those in the central region. Accordingly, wave velocities in the first edge region and the second edge region become smaller than a wave velocity in the central region.

Even though not only the first inter-digital electrodes 610 but also the second inter-digital electrodes 620 may include protruding portions having larger thicknesses in the first edge region than those in the central region, it is difficult to form protruding portions having larger thicknesses in the respective adjacent electrodes. Like this, even though not only the second inter-digital electrodes 620 but also the first inter-digital electrodes 610 may include protruding portions having larger thicknesses in the second edge region than those in the central region, it is difficult to form protruding portions having larger thicknesses in the respective adjacent electrodes.

In the embodiment of the present invention, in the first edge region, the first inter-digital electrodes 610 include the protruding portions 611 but the second inter-digital electrodes 620 do not include protruding portions. Like this, in the second edge region, the second inter-digital electrodes 620 include the protruding portions 621 but the first inter-digital electrodes 610 do not include protruding portions. Accordingly, there are a merit in process and an advantage of decreasing a fraction defective rather than a case of forming protruding portions at both the first inter-digital electrodes 610 and the second inter-digital electrodes 620 in the same edge region.

Figure 6:
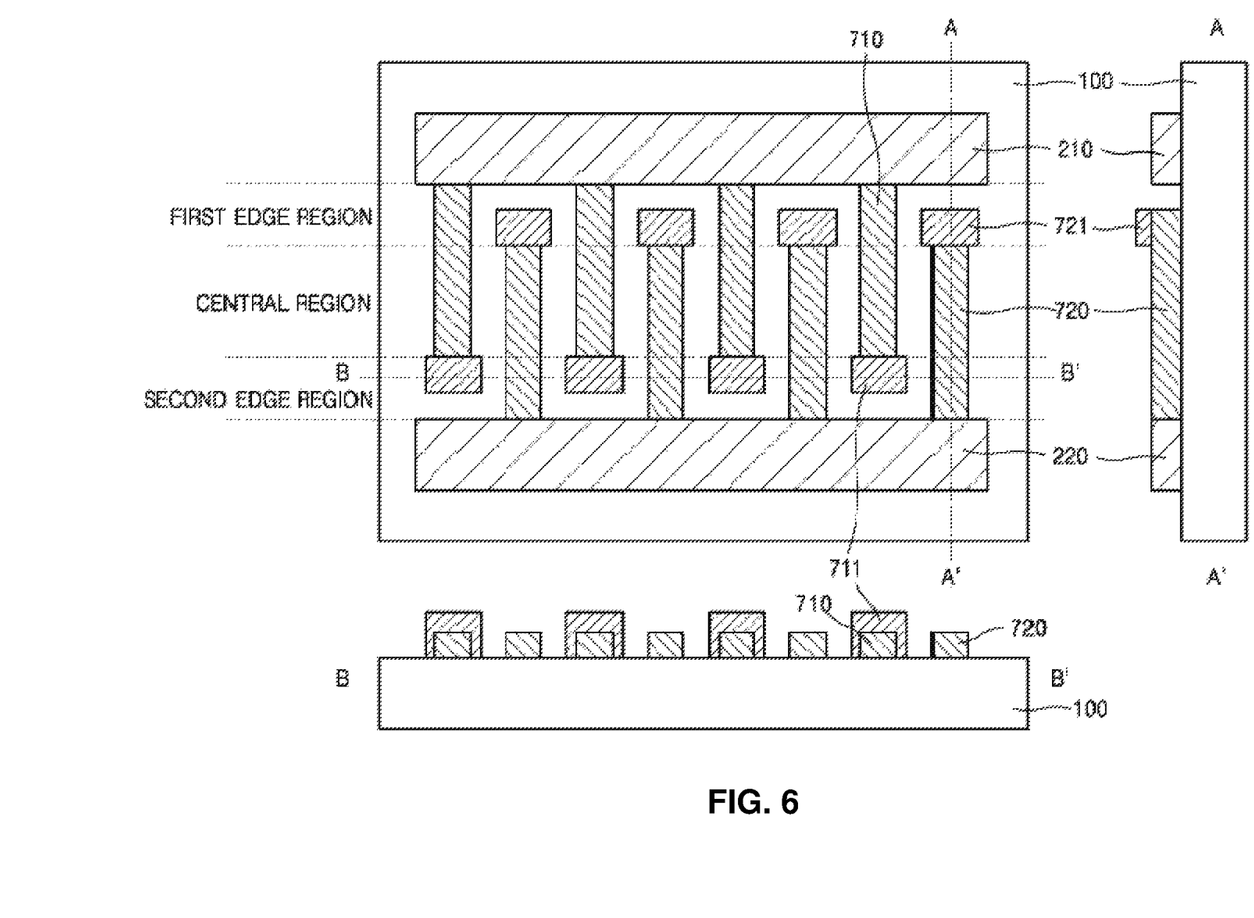
FIG. 6 is a view illustrating a structure of a surface acoustic wave device according to a fifth embodiment of the present invention.

FIG. 6 is a view illustrating a structure of a surface acoustic wave device according to a fifth embodiment of the present invention.

Referring to FIG. 6, the surface acoustic wave device according to the embodiment includes a piezoelectric substrate 100, first and second bus bar 210 and 220 formed on the piezoelectric substrate 100 to be opposite each other, a plurality of first inter-digital electrodes 710 that are electrically connected to the first bus bar 210 and extend from the first bus bar 210 toward the second bus bar 220, and a plurality of second inter-digital electrodes 720 that are electrically connected to the second bus bar 220 and extend from the second bus bar 220 toward the first bus bar 210. Here, the first inter-digital electrodes 710 and the second inter-digital electrodes 720 are alternately arranged.

The second inter-digital electrodes 720 include protruding portions 721 having larger widths and thicknesses in the first edge region than those in the central region, and the first inter-digital electrodes 710 include protruding portions 711 having larger widths and thicknesses in the second edge region than those in the central region. Accordingly, wave velocities in the first edge region and the second edge region become smaller than a wave velocity in the central region.

In the first edge region, the protruding portions of not only the second inter-digital electrodes 720 but also the first inter-digital electrodes 710 may have larger widths and thicknesses than the widths and thicknesses in the central region. However, since a gap between the protruding portion 721 of the second inter-digital electrode 720 and the protruding portion of the first inter-digital electrode 710 becomes narrower, there is a difficulty in embodying a corresponding electrode pattern. Like this, in the second edge region, the protruding portions of not only the first inter-digital electrodes 710 but also the second inter-digital electrodes 720 may have larger widths and thicknesses than the widths and thicknesses in the central region. However, since a gap between the protruding portion 711 of the first inter-digital electrode 710 and the protruding portion of the second inter-digital electrode 720 adjacent thereto becomes narrower, there is a difficulty in embodying a corresponding electrode pattern.

In the embodiment of the present invention, in the first edge region, the second inter-digital electrodes 720 include the protruding portions 721 but the first inter-digital electrodes 710 do not include protruding portions. Like this, in the second edge region, the first inter-digital electrodes 710 include the protruding portions 711 but the second inter-digital electrodes 720 do not include protruding portions. Accordingly, there are a merit in process and an advantage of decreasing a fraction defective rather than a case of forming protruding portions at both the first inter-digital electrodes 710 and the second inter-digital electrodes 720 in the same edge region.

Figure 7:
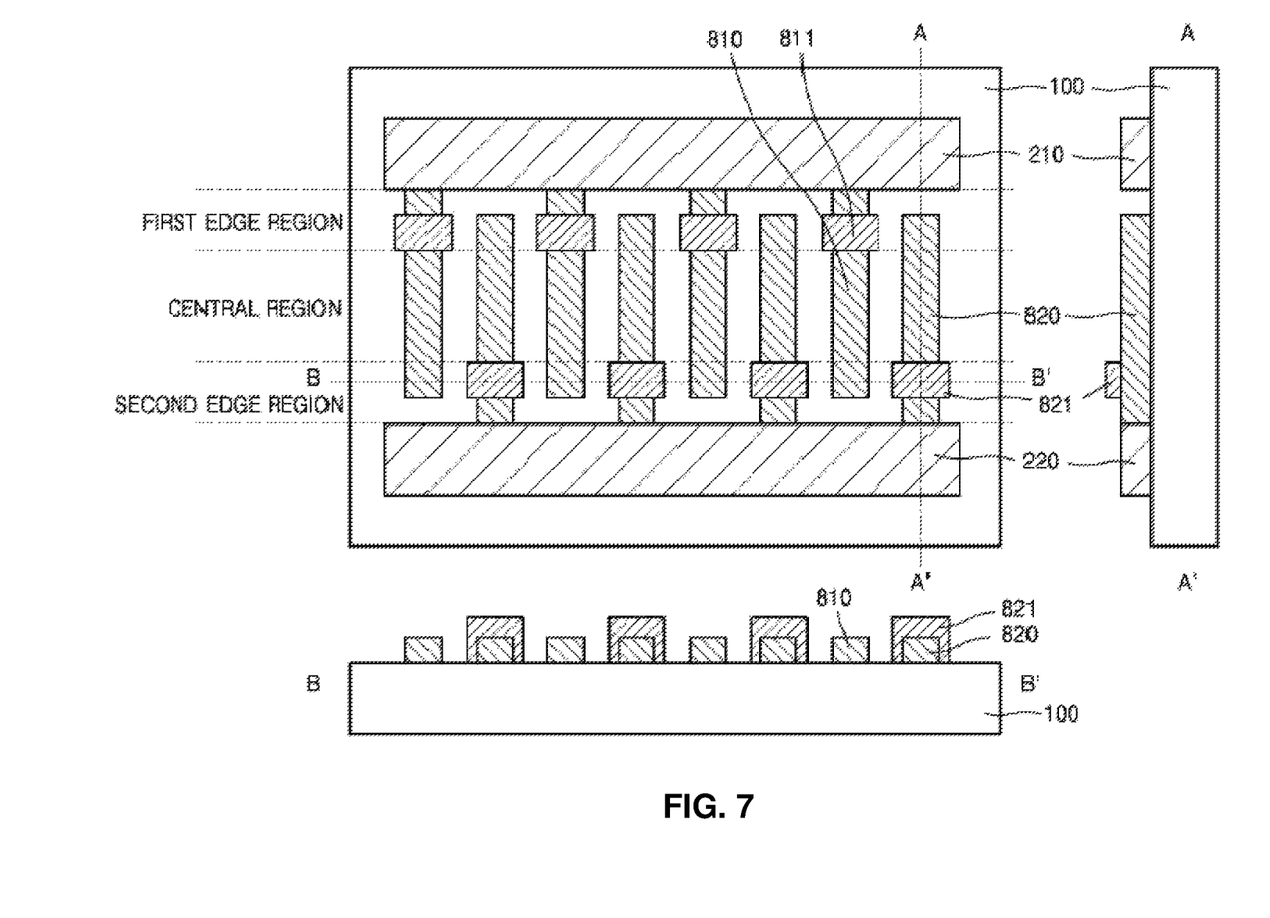
FIG. 7 is a view illustrating a structure of a surface acoustic wave device according to a sixth embodiment of the present invention.

FIG. 7 is a view illustrating a structure of a surface acoustic wave device according to a sixth embodiment of the present invention.

Referring to FIG. 7, the surface acoustic wave device according to the embodiment includes a piezoelectric substrate 100, first and second bus bar 210 and 220 formed on the piezoelectric substrate 100 to be opposite each other, a plurality of first inter-digital electrodes 810 that are electrically connected to the first bus bar 210 and extend from the first bus bar 210 toward the second bus bar 220, and a plurality of second inter-digital electrodes 820 that are electrically connected to the second bus bar 220 and extend from the second bus bar 220 toward the first bus bar 210. Here, the first inter-digital electrodes 810 and the second inter-digital electrodes 820 are alternately arranged.

The first inter-digital electrodes 810 include protruding portions 811 having larger widths and thicknesses in the first edge region than those in the central region, and the second inter-digital electrodes 820 include protruding portions 821 having larger widths and thicknesses in the second edge region than those in the central region. Accordingly, wave velocities in the first edge region and the second edge region become smaller than a wave velocity in the central region.

In the first edge region, the protruding portions of not only the first inter-digital electrodes 810 but also the second inter-digital electrodes 820 may have larger widths and thicknesses than the widths and thicknesses in the central region. However, since a gap between the protruding portion 811 of the first inter-digital electrode 810 and the protruding portion of the second inter-digital electrode 820 becomes narrower, there is a difficulty in embodying a corresponding electrode pattern. Like this, in the second edge region, the protruding portions of not only the second inter-digital electrodes 820 but also the first inter-digital electrodes 810 may have larger widths and thicknesses than the widths and thicknesses in the central region. However, since a gap between the protruding portion 821 of the second inter-digital electrode 820 and the protruding portion of the first inter-digital electrode 810 adjacent thereto becomes narrower, there is a difficulty in embodying a corresponding electrode pattern.

In the embodiment of the present invention, in the first edge region, the first inter-digital electrodes 810 include the protruding portions 811 but the second inter-digital electrodes 820 do not include protruding portions. Like this, in the second edge region, the second inter-digital electrodes 820 include the protruding portions 821 but the first inter-digital electrodes 810 do not include protruding portions. Accordingly, there are a merit in process and an advantage of decreasing a fraction defective rather than a case of forming protruding portions at both the first inter-digital electrodes 810 and the second inter-digital electrodes 820 in the same edge region.

According to the present invention, it is possible to suppress a transverse mode using a simpler structure and accordingly realization is easy and a possibility that a failure occurs is low.

While the exemplary embodiments of the present invention have been described above, it should be appreciated by one of ordinary skill in the art that modifications may be made without departing from the essential features of the present invention. Therefore, the disclosed embodiments should be considered not in a limitative point of view but in a descriptive point of view. It should be appreciated that the scope of the present invention is defined by the claims not by the above description and includes all differences within the equivalent scope thereof.

What is claimed is:

1. A surface acoustic wave device comprising:
   a piezoelectric substrate;
   first and second bus bars formed on the piezoelectric substrate to be opposite each other;
   a plurality of first inter-digital electrodes that are electrically connected to the first bus bar and extend from the first bus bar toward the second bus bar; and
   a plurality of second inter-digital electrodes that are electrically connected to the second bus bar and extend from the second bus bar toward the first bus bar, in which the first inter-digital electrodes and the second inter-digital electrodes are alternately arranged,
   wherein a central region of the first and second inter-digital electrodes, a first edge region between the central region and the first bus bar, and a second edge region between the central region and the second bus bar are defined according to a wave propagation direction, and
   wherein protruding portions are formed at only the second inter-digital electrodes in the first edge region and formed at only the first inter-digital electrodes in the second edge region to allow wave velocities in the first and second edge regions to be smaller than a wave velocity in the central region.

2. The surface acoustic wave device of claim 1, wherein widths of the protruding portions are larger than widths of the first and second inter-digital electrodes in the central region.

3. The surface acoustic wave device of claim 1, wherein thicknesses of the protruding portions are larger than thicknesses of the first and second inter-digital electrodes in the central region.

4. The surface acoustic wave device of claim 1, wherein widths and thicknesses of the protruding portions are larger than widths and thicknesses of the first and second inter-digital electrodes in the central region.

* * * * *